(12) United States Patent
Kagaya (10) Patent No.: US 7,986,020 B2
(45) Date of Patent: Jul. 26, 2011

(54) OPTICAL COMMUNICATION MODULE AND FLEXIBLE PRINTED CIRCUIT BOARD

(75) Inventor: Osamu Kagaya, Tokyo (JP)

(73) Assignee: Opnext Japan, Inc., Kanagawa (JP)

( * ) Notice: Subject to any disclaimer, the term of this patent is extended or adjusted under 35 U.S.C. 154(b) by 288 days.

(21) Appl. No.: 12/423,612

(22) Filed: Apr. 14, 2009

(65) Prior Publication Data

US 2009/0263140 A1    Oct. 22, 2009

(30) Foreign Application Priority Data

Apr. 22, 2008   (JP) .................................. 2008-111869

(51) Int. Cl.
*H01L 31/0232*   (2006.01)
(52) U.S. Cl. ......... 257/432; 257/662; 257/663; 257/664
(58) Field of Classification Search .................. 257/432, 257/662–664
See application file for complete search history.

(56) References Cited

U.S. PATENT DOCUMENTS 7,010,179 B2 *   3/2006   Hatta et al. ........................ 385/1

FOREIGN PATENT DOCUMENTS

| JP | 3084970 B2 | 9/2000 |
| JP | 2004-193489 | 7/2004 |

OTHER PUBLICATIONS

"850 nm XFP Transceiver Reference Design HFRD-19.2 (Rev.2, Oct. 2007)", retrieved from http://pdfserv.maxim-ic.com/jp/an/AN3730J.pd on Dec. 24, 2007, by Maxim Integrated Products.

* cited by examiner

*Primary Examiner* — Thien F Tran
(74) *Attorney, Agent, or Firm* — McDermott Will & Emery LLP (57) ABSTRACT

A flexible printed circuit board includes: a signal wiring pattern including: a transmission line for connecting an end of an optical device with an end of a signal generation circuit; and another transmission line for connecting another end of the optical device with another end of the signal generation circuit; a thin film resistor layer formed in a region including a region facing the signal wiring pattern so as to constitute a first microstrip line together with each of the transmission lines; a ground conductor formed in a region except a part of a region facing the thin film resistor layer within a region including a region facing the signal wiring pattern so as to constitute a second microstrip line together with each of the transmission lines; and an insulating layer formed between each two of the signal wiring pattern, the thin film resistor layer, and the ground conductor.

8 Claims, 8 Drawing Sheets

CASE OF MATCHING AT 100 OHMS AT BOTH ENDS

OPTICAL COMMUNICATION MODULE AND FLEXIBLE PRINTED CIRCUIT BOARD

CROSS-REFERENCE TO RELATED APPLICATION

The present application claims priority from Japanese application JP 2008-111869 filed on Apr. 22, 2008, the content of which is hereby incorporated by reference into this application.

BACKGROUND OF THE INVENTION

1. Field of the Invention

The present invention relates to an optical communication module and a flexible printed circuit board. In particular, the present invention relates to a structure of a flexible printed circuit board for connecting a main board of an optical communication module having a high speed transmission rate (e.g., 10 Gbit/s) with a small optical device for transmission or reception.

2. Description of the Related Art

In recent years, downsizing and speeding up of a transceiver module for optical fiber transmission (optical transceiver module) has been achieved along with the widespread use of broadband networks. Concerning the speeding up, optical transceiver modules having a bit rate of 10 Gbit/s are widely used at present. As to the downsizing, a case volume has been reduced from the 300 pin multi source agreement (MSA) standard of the old generation to XENPAK (10 gigabit Ethernet transceiver package), X2, XFP (10 gigabit small form factor pluggable), and SFP+ (small form factor pluggable) (MSA standard each).

Such an optical transceiver module uses a transmitter optical sub-assembly (TOSA) having an optical connector interface and a receiver optical sub-assembly (ROSA) having an optical connector interface, and hence downsizing of the module is realized. In addition, most of the optical transceiver modules use a flexible printed circuit board (FPC) having flexibility for connecting the TOSA or the ROSA with the main board, and hence a stress due to a dimensional error in the mounting process or a thermal distortion is absorbed for preventing a failure caused by the stress (see, for example, "850 nm XFP Transceiver Reference Design HFRD-19.2 (Rev. 2, October 2007)", (online), Maxim, retrieved on Dec. 24, 2007, the Internet URL: http://pdfserv.maxim-ic.com/jp/an/AN3730J.pdf (hereinafter referred to as "Non-Patent Document 1").

Further, JP 2004-193489 A (hereinafter referred to as "Patent Document 1") discloses an optical transmission module in which a TOSA is driven by a differential driver IC. In addition, Patent Document 1 discloses in Paragraph 0020 and in FIG. 5 a technology for improving waveform deterioration of an optical signal generated in the TOSA by disposing a resistor element between an end of a semiconductor laser device and the ground potential so as to improve impedance mismatch between a differential transmission line and the semiconductor laser device.

In addition, JP 3084970 B2 (hereinafter referred to as "Patent Document 2") discloses a technology for improving impedance mismatch by inserting resistor elements in series in a signal wiring on an FPC.

In a 10 Gbit/s optical transceiver module having a transmission distance of 300 meters or shorter, a vertical cavity surface emitting laser (VCSEL) device having a wavelength of 0.85 µm is widely used as the semiconductor laser device for transmission. This device has features that a series resistance is relatively high like 50 to 100 ohms and that necessary drive current is small like several milliamperes.

According to the study carried out by the inventors of the present invention, if an output signal (differential signal) of a balanced (differential) driver IC having a differential output impedance of 100 ohms is supplied to an anode terminal and a cathode terminal of the semiconductor laser device via a balanced (differential) transmission line (differential line) having characteristic impedance of 100 ohms, impedance matching between the transmission line and the laser device can be performed well, and hence an optical output waveform of the optical transceiver module can be improved.

On the other hand, as to a common mode operation, it is possible to maintain the matching between the balanced driver IC and the differential line. However, the semiconductor laser device connected in series to the ends of the two lines is in the open state with respect to the common mode operation, and hence a common mode signal is totally reflected. Therefore, depending on characteristics of the driver IC, if the common mode signal that is a parasitic component that is not originally essential for the output of the driver IC is superimposed on the output signal as noise, a large electromagnetic radiation may be generated by the impedance mismatch, which causes a problem that the specification about unintentional electromagnetic radiation cannot be satisfied. Note that generation factors of the common mode signal include a switching operation of the driver IC or the cross point adjustment.

Concerning this point, the technology described in the above-mentioned Patent Document 1 can avoid the impedance mismatch with respect to the common mode signal by setting a resistance value of a resistor element for impedance matching disposed between the terminal of the laser device and the ground potential to be low (e.g., 50 ohms or its vicinity). In this case, however, high frequency current of the differential signal for driving the laser device and bias current of the laser device are consumed by the resistor element for the impedance matching. Therefore, there is a problem that higher drive current and bias current are necessary for obtaining a desired good output optical waveform, which causes an increase in power consumption.

On the other hand, if the technology disclosed in Patent Document 2 is applied to the optical transceiver module disclosed in Non-Patent Document 1, the impedance mismatch with respect to the common mode signal cannot be avoided. Specifically, if resistor elements are inserted in series in a signal wiring on the FPC of the optical transceiver module disclosed in Non-Patent Document 1, the semiconductor laser device is in the open state with respect to the common mode operation. Therefore, the impedance mismatch cannot be resolved even if the resistor elements are inserted in series in the signal wiring on the FPC. In this case, therefore, the problem of the unintentional electromagnetic radiation cannot be solved.

SUMMARY OF THE INVENTION

The present invention has been created in view of the above-mentioned conventional problems, and it is therefore an object thereof to provide an optical communication module and a flexible printed circuit board that can decrease both the unintentional electromagnetic waves radiated when the high frequency differential signal is transmitted and the power consumption.

In order to solve the above-mentioned problems, an optical communication module according to the present invention includes an optical device; a main board incorporating a signal generation circuit for generating a high frequency signal corresponding to an optical signal converted by the optical device; and a flexible printed circuit board for connecting the optical device with the main board. The flexible printed circuit board includes: a signal wiring pattern including: a first transmission line for connecting an end of the optical device with an end of the signal generation circuit; and a second transmission line for connecting another end of the optical device with another end of the signal generation circuit; a thin film resistor layer formed in a region including at least a part of a region facing the signal wiring pattern so as to constitute a first microstrip line together with each of the first transmission line and the second transmission line; a ground layer formed in a region except a part of a region facing the thin film resistor layer within a region including a region facing the signal wiring pattern so as to constitute a second microstrip line together with the each of the first transmission line and the second transmission line; and an insulating layer formed between each two of the signal wiring pattern, the thin film resistor layer, and the ground layer.

In the present invention, the microstrip line included in the flexible printed circuit board has the first microstrip line made up of a pair of the transmission lines and the thin film resistor layer, and the second microstrip line made up of a pair of the transmission lines and the ground layer. Here, when the high frequency signal is transmitted through the first microstrip line, eddy current is generated in the thin film resistor layer by a variation of magnetic fluxes generated in the vicinity of the microstrip line, and a part of the high frequency signal is consumed as heat. According to the present invention, the common mode component (common mode signal) contained in the high frequency differential signal transmitted through the microstrip line is consumed as heat in the thin film resistor layer formed in the flexible printed circuit board, and hence the unintentional electromagnetic waves radiated due to reflection of the common mode signal can be reduced. In addition, it is not necessary to provide the resistor element for impedance matching between the terminal of the optical device and the ground potential, and hence it is also possible to prevent an increase in power consumption.

Note that the optical device mentioned here corresponds to a light emitting device such as a semiconductor laser diode, a transmitter optical sub-assembly incorporating a light emitting device, a light receiving device such as a photodiode, a receiver optical sub-assembly incorporating a light receiving device and a preamplifier for amplifying an output signal of the light receiving device, or the like. In addition, the signal generation circuit corresponds to a transmitting circuit such as a driver IC for driving the light emitting device, a receiving circuit such as a post amplifier for amplifying an output signal of the light receiving device, or the like.

In an aspect of the present invention, the signal wiring pattern is formed so that a space between the first transmission line and the second transmission line in a part facing the thin film resistor layer is smaller than a space in another part.

At the part with the small space between the first transmission line and the second transmission line, coupling between the differential signals becomes strong. As a result, density of the magnetic flux generated by transmission of the differential signal at the part in the thin film resistor layer is decreased. In other words, the eddy current at the part in the thin film resistor layer, which flows accompanying with transmission of the differential signal is decreased. According to this aspect, a loss in the differential signal can be suppressed while the common mode signal can be reduced significantly.

In another aspect of the present invention, the first transmission line and the second transmission line are formed so that a width of the part facing the thin film resistor layer is larger than a width of the another part.

According to this aspect, the space between the first transmission line and the second transmission line can be decreased without bending the transmission lines. Therefore, cost of forming the signal wiring pattern can be reduced.

In still another aspect of the present invention, the ground layer is formed so that the part of the region facing the thin film resistor layer is an opening part. Note that a shape of the opening part of the ground layer may be determined based on a width of the transmission line, a space between the signal wiring pattern and the thin film resistor layer, a space between the signal wiring pattern and the ground layer, a shape of the thin film resistor layer, or the like so that the characteristic impedance of the first microstrip line becomes a predetermined value.

Note that, in the aspects of the present invention described above, the ground layer, the thin film resistor layer, and the signal wiring pattern may be laminated in the stated order sandwiching the insulating layer. Further, the ground layer, the signal wiring pattern, and the thin film resistor layer may be laminated in the stated order sandwiching the insulating layer. Further, the thin film resistor layer, the ground layer, and the signal wiring pattern may be laminated in the stated order sandwiching the insulating layer.

Further, a flexible printed circuit board according to the present invention is for connecting an optical device with a main board incorporating a signal generation circuit for generating a high frequency signal corresponding to an optical signal converted by the optical device. The flexible printed circuit board includes: a signal wiring pattern including: a first transmission line for connecting an end of the optical device with an end of the signal generation circuit; and a second transmission line for connecting another end of the optical device and another end of the signal generation circuit; a thin film resistor layer formed in a region including at least a part of a region facing the signal wiring pattern so as to constitute a first microstrip line together with each of the first transmission line and the second transmission line; a ground layer formed in a region except a part of a region facing the thin film resistor layer within a region including a region facing the signal wiring pattern so as to constitute a second microstrip line together with the each of the first transmission line and the second transmission line; and an insulating layer formed between each two of the signal wiring pattern, the thin film resistor layer, and the ground layer.

According to the present invention, the common mode component (common mode signal) contained in the high frequency differential signal transmitted through the microstrip line is consumed as heat in the thin film resistor layer formed in the flexible printed circuit board. Therefore, the unintentional electromagnetic waves radiated due to reflection of the common mode signal can be reduced. In addition, it is not necessary to provide the resistor element for impedance matching between the terminal of the optical device and the ground potential, and hence it is also possible to prevent an increase in power consumption. Specifically, according to the present invention, it is possible to provide the optical communication module and the flexible printed circuit board that can decrease both the unintentional electromagnetic waves radiated when the high frequency differential signal is transmitted and the power consumption.

DETAILED DESCRIPTION OF THE INVENTION

Hereinafter, four embodiments of the present invention are described with reference to the attached drawings. Note that the same component is denoted by the same reference numeral so as to omit overlapping description.

Embodiment 1

An optical transceiver module according to Embodiment 1 of the present invention is described with reference to FIGS. 1 to 8. The optical transceiver module according to Embodiment 1 is a 10 Gbit/s optical transceiver module having a wavelength of 0.85 μm.

Figure 1:
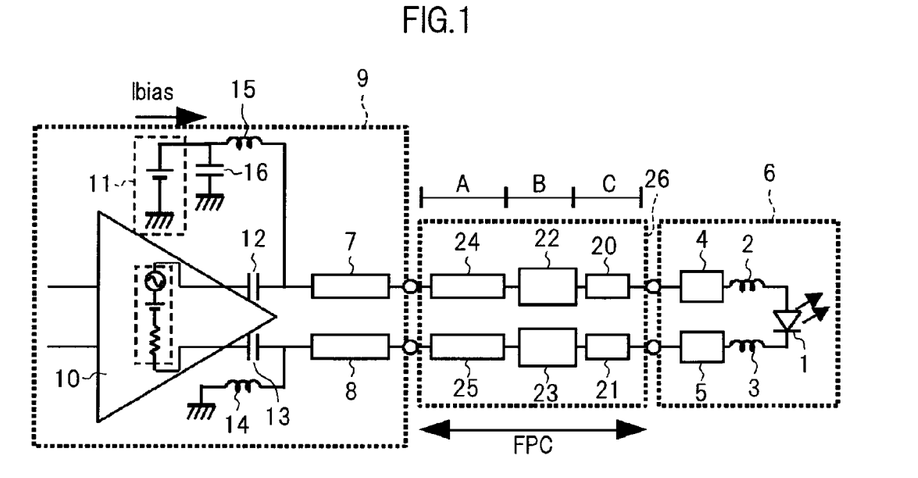
FIG. 1 is a circuit diagram of a transmitting part of an optical transceiver module according to Embodiment 1 of the present invention.

First, a structure of a transmitting part of the optical transceiver module according to Embodiment 1 is described with reference to FIG. 1. FIG. 1 is a circuit diagram of the transmitting part of the optical transceiver module according to Embodiment 1. As illustrated in FIG. 1, the optical transceiver module according to Embodiment 1 includes a TOSA 6, a main board 9 on which a driver IC 10 is mounted, and a flexible printed circuit board 26 for connecting the TOSA 6 with the main board 9.

A VCSEL device 1 having a wavelength of 0.85 μm and transmission lines 4 and 5 are disposed in the TOSA 6. An anode terminal and a cathode terminal of the VCSEL device 1 are respectively connected to transmission lines 20 and 21 formed in the flexible printed circuit board 26 via bonding wires 2 and 3 and the transmission lines 4 and 5.

The transmission lines 4 and 5 are formed on a ceramic substrate made of alumina, aluminum nitride or the like, for example. Each of the transmission lines 4 and 5 constitutes a microstrip line. It is preferable to set each characteristic impedance value of the transmission lines 4 and 5 to be 50 ohms for impedance matching. The bonding wires 2 and 3 are equivalent to series inductances on the circuit, and hence it is preferable to use a wire having a length as short as possible or a plurality of wires for each of the bonding wires 2 and 3 so that the inductance value is reduced for decreasing reflection of a signal.

The flexible printed circuit board 26 includes three regions (A, B and C). Specifically, the flexible printed circuit board 26 has a structure in which the differential transmission lines 20 and 21 formed in the region C, differential transmission lines 22 and 23 formed in the region B and differential transmission lines 24 and 25 formed in the region A are connected in series. The transmission lines 20 and 21 in the region C and the transmission lines 24 and 25 in the region A respectively constitute microstrip lines having a differential impedance of 100 ohms. In addition, as described later, the transmission lines 22 and 23 in the region B respectively constitute microstrip lines having a differential impedance of approximately 100 ohms.

The main board 9 is a printed circuit board made of a material of FR4, FR5 or the like, for example. Transmission lines 7 and 8, a driver IC 10, a voltage source 11, DC cut capacitors 12 and 13, choke coils 14 and 15 and a decoupling capacitor 16 are disposed on the main board 9.

The transmission lines 7 and 8 respectively constitute microstrip lines having a differential impedance of 100 ohms. The driver IC 10 is a balanced driver IC having a differential output impedance of 100 ohms. Output terminals of the driver IC 10 are respectively connected to the differential transmission lines 7 and 8 via the DC cut capacitors 12 and 13.

A DC bias current for the VCSEL device 1 is supplied from the voltage source 11 via a bias tee circuit including the decoupling capacitor 16 and the choke coil 15 to the transmission line 7, and flows from the transmission line 8 via the choke coil 14 to the ground potential.

Figure 2:
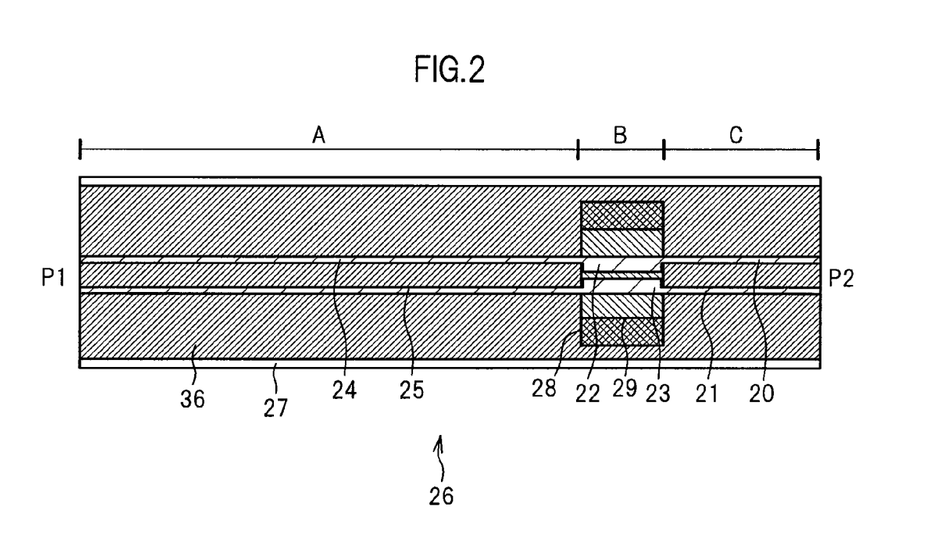
FIG. 2 is a top view of a flexible printed circuit board according to Embodiment 1 of the present invention.
Figure 3:
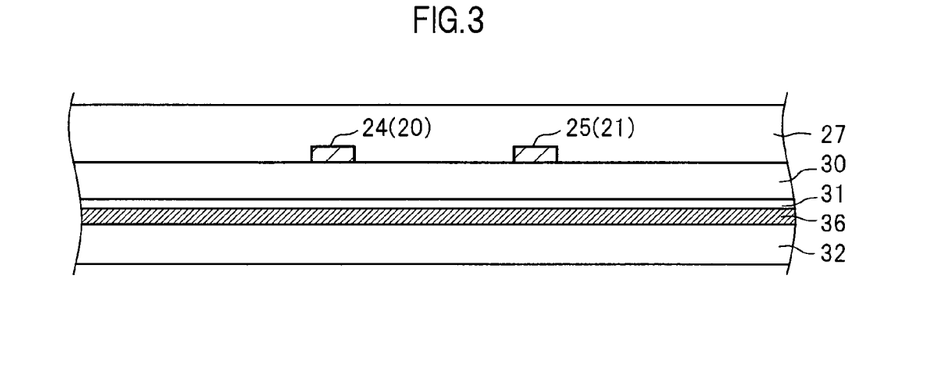
FIG. 3 is a cross sectional view of the flexible printed circuit board according to Embodiment 1 of the present invention.
Figure 4:
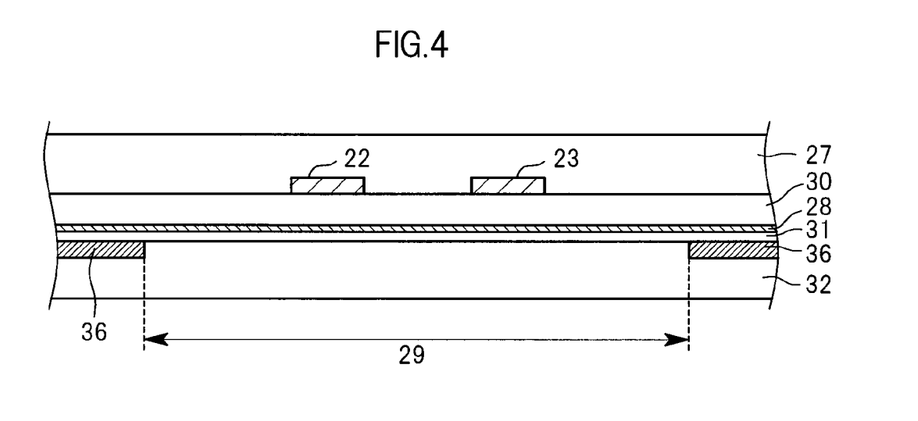
FIG. 4 is a cross sectional view of the flexible printed circuit board according to Embodiment 1 of the present invention.

Next, the structure of the flexible printed circuit board 26 is described in more detail with reference to FIGS. 2 to 4. FIG. 2 is a top view of the flexible printed circuit board 26. FIG. 3 is a cross sectional view of the flexible printed circuit board 26 in the region A (or the region C). FIG. 4 is a cross sectional view of the flexible printed circuit board 26 in the region B.

The region A (or the region C) on the flexible printed circuit board 26 has a structure as illustrated in FIG. 3, in which a dielectric layer (insulating layer) 32, a ground conductor (ground layer) 36, dielectric layers (insulating layers) 31 and 30, the transmission lines 24 and 25 (or 20 and 21), and a dielectric layer (insulating layer) 27 are laminated in this order.

Each of the transmission lines 24 and 25 (or 20 and 21) constitutes an ordinary microstrip line together with the ground conductor 36. Specifically, the transmission lines 24 and 25 (or 20 and 21) serving as strip conductors are formed on the top surface of the dielectric layer 30, and the ground conductor 36 is formed on the bottom surface of the dielectric layer 31 so as to face the transmission lines 24 and 25 (or 20 and 21). In addition, the dielectric layers 27 and 32, each of which is made of a composite material of polyimide and adhesive, are formed on top and bottom of them to cover the microstrip lines.

Each of the transmission lines 24 and 25 is made of copper foil that has a thickness of 28 μm and is cut to have a width of 80 μm. The ground conductor 36 is made of copper foil having a thickness of 28 μm. As a material of the dielectric layers 30 and 31, polyimide and adhesive are used. For instance, the dielectric layer 30 is made of a composite material of polyimide and adhesive, and the dielectric layer 31 is made of polyimide. A thickness of the former is set to be 38 μm, and a thickness of the latter is set to be 12 μm. This structure constitutes the microstrip line having a differential impedance of 100 ohms.

On the other hand, the region B on the flexible printed circuit board 26 has a structure in which the dielectric layer 32, the ground conductor 36, the dielectric layer 31, a thin film resistor layer 28, the dielectric layer 30, the transmission lines 22 and 23, and the dielectric layer 27 are laminated in this order as illustrated in FIG. 4.

Each of the transmission lines 22 and 23 constitutes a microstrip line together with the thin film resistor layer 28. Specifically, the transmission lines 22 and 23 serving as the strip conductors are formed on the top surface of the dielectric layer 30, and the thin film resistor layer 28 is formed on the bottom surface of the dielectric layer 30 so as to face the transmission lines 22 and 23.

This thin film resistor layer 28 has a function of attenuating a part of the high frequency signal transmitted through the microstrip line. It is because when the high frequency signal is transmitted through the microstrip line, magnetic fluxes generated in the vicinity of the microstrip line vary and cause eddy current in the thin film resistor layer 28, whereby a part of the high frequency signal is consumed as heat. Note that the thin film resistor layer 28 preferably has a thickness of 1 μm or thinner and a sheet resistance value of 25 to 200 ohms.

In addition, as illustrated in FIGS. 2 to 4, the transmission lines 22 and 23 in the region B are formed to have a larger width in the inward direction compared with the transmission lines 24 and 25 (or 20 and 21) in the region A (region C). It is for the purpose of decreasing the space between the transmission lines 22 and 23 in the region B to be smaller than the space between the transmission lines 24 and 25 (or 20 and 21) in the region A (region C).

In the part having a small space between the differential lines, coupling between the differential signals becomes strong. For this reason, in the region B having the small space between the transmission lines 22 and 23, density of the magnetic flux in the thin film resistor layer 28 generated along with the transmission of the differential signal is low, and hence the eddy current flowing in the thin film resistor layer 28 is low. In contrast, even if the space between the differential lines becomes small, coupling between the common mode signals does not occur. Therefore, in the region B having a small space between the transmission lines 22 and 23, it is possible to suppress a loss of the differential signal and to reduce the common mode signal significantly.

Note that the transmission lines 22 and 23 having a larger width than the transmission lines 24 and 25 (or 20 and 21) act so as to reduce the differential impedance of the microstrip line in the region B.

In addition, as illustrated in FIG. 4, the ground conductor 36 is formed on the bottom surface of the dielectric layer 31 in the region facing a part of the thin film resistor layer 28 except for the region facing the transmission lines 22 and 23. In other words, the ground conductor 36 having an opening part 29 that is a part of the region facing the thin film resistor layer 28 is formed on the bottom surface of the dielectric layer 31 as illustrated in FIG. 2.

The thin film resistor layer 28 is not connected via a conductor to any of the transmission lines 22 and 23 and the ground conductor 36 connected to the ground potential, and hence it is in a floating state in terms of DC. However, the thin film resistor layer 28 is coupled electromagnetically to the ground conductor 36 for a high frequency signal in the region where they face each other. In the region where the thin film resistor layer 28 is coupled electromagnetically to the ground conductor 36, potential of the thin film resistor layer 28 becomes close to the ground potential. Therefore, a distance between the transmission line 22 or 23 and the ground potential is reduced, which acts so as to decrease the differential impedance of the microstrip line in the region B. On the contrary, the opening part 29 of the ground conductor 36 increases the distance between the transmission line 22 or 23 and the ground potential. In other words, the opening part 29 works to increase the differential impedance of the microstrip line in the region B. Therefore, the opening part 29 of the ground conductor 36 is an essential structure for setting the differential impedance of the microstrip line in the region B to be close to 100 ohms.

In the region B on the flexible printed circuit board 26, the width of the transmission lines 22 and 23 is set to be 140 μm, the space between the transmission lines 22 and 23 is set to be 200 μm, the width of the opening part 29 of the ground conductor 36 is set to be 1.2 mm, and the width of the thin film resistor layer 28 is set to be 2.6 mm, and hence as to constitute the microstrip line having a differential impedance close to 100 ohms.

Note that the sheet resistance of the thin film resistor layer 28 and the length of the region B can be changed as design values for obtaining desired characteristics. For instance, the sheet resistance was set to be 25 ohms, the length of the region B was set to be 2.4 mm, and the entire length of the flexible printed circuit board 26 was set to be 10 mm, whereby the following characteristics were obtained.

Hereinafter, the effect according to Embodiment 1 of the present invention is described with reference to FIGS. 5 to 8 illustrating small signal characteristics.

Figure 5:
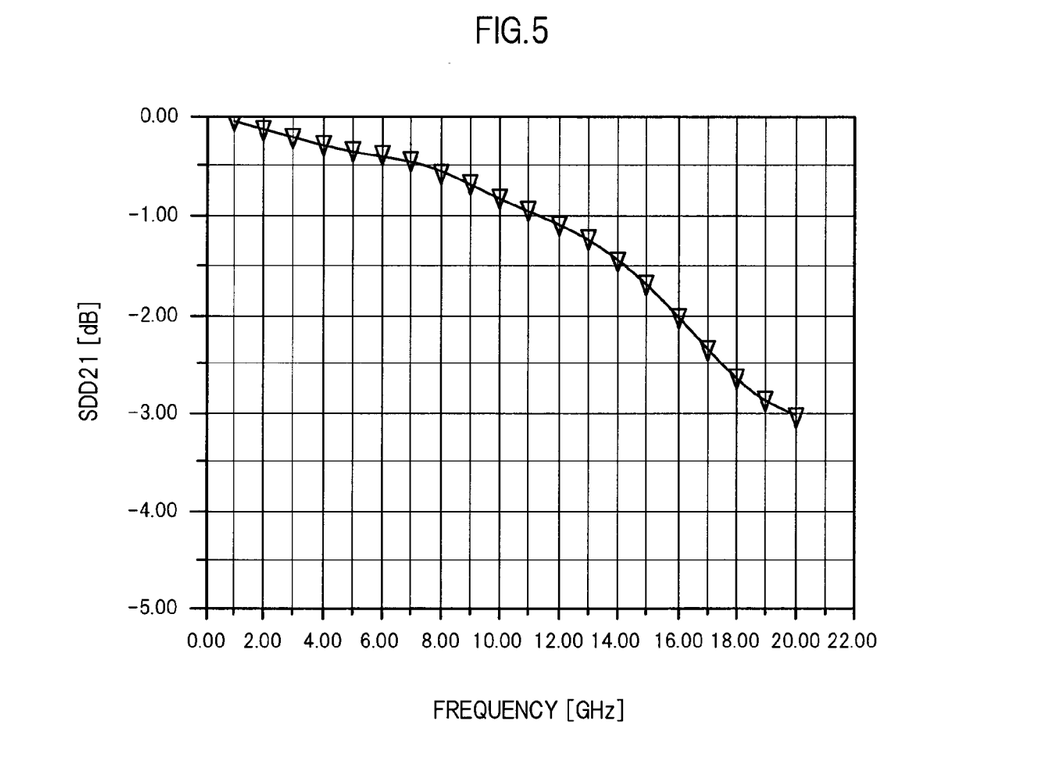
FIG. 5 is a graph illustrating differential mode transmission characteristics of the flexible printed circuit board according to Embodiment 1 of the present invention.

FIG. 5 is a graph illustrating differential mode transmission characteristics SDD21 between both ends of the flexible printed circuit board 26 (between P1 and P2 of FIG. 2). As illustrated in FIG. 5, a transmission loss at a frequency of 10 GHz shows a relatively small value of 0.8 dB.

Figure 6:
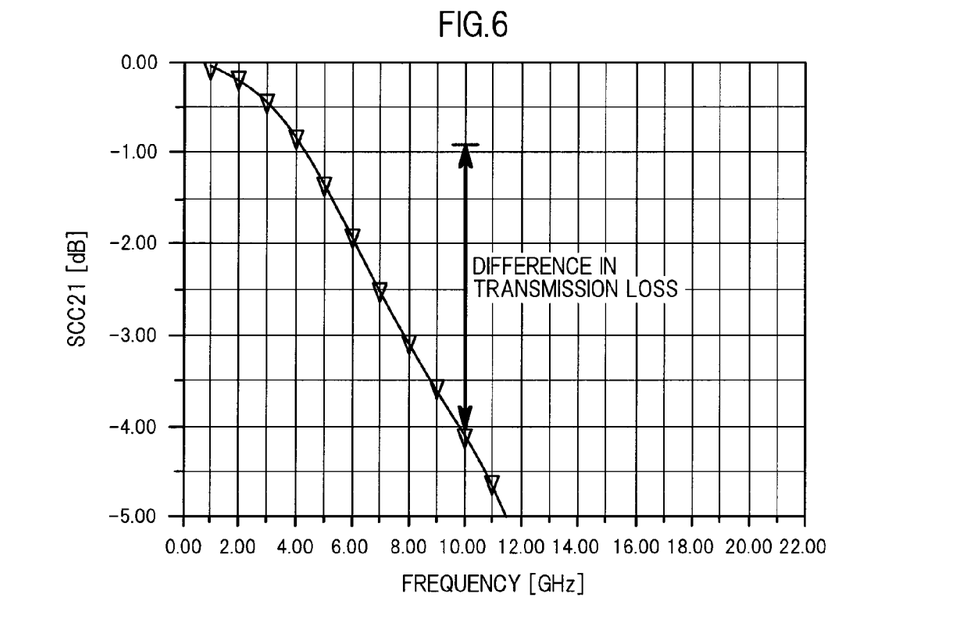
FIG. 6 is a graph illustrating common mode transmission characteristics of the flexible printed circuit board according to Embodiment 1 of the present invention.

FIG. 6 is a graph illustrating common mode transmission characteristics SCC21 between both ends of the flexible printed circuit board 26 (between P1 and P2). As illustrated in FIG. 6, the transmission loss at a frequency of 10 GHz is 4.1 dB that is at least four times the value in the case of the differential mode.

Figure 7:
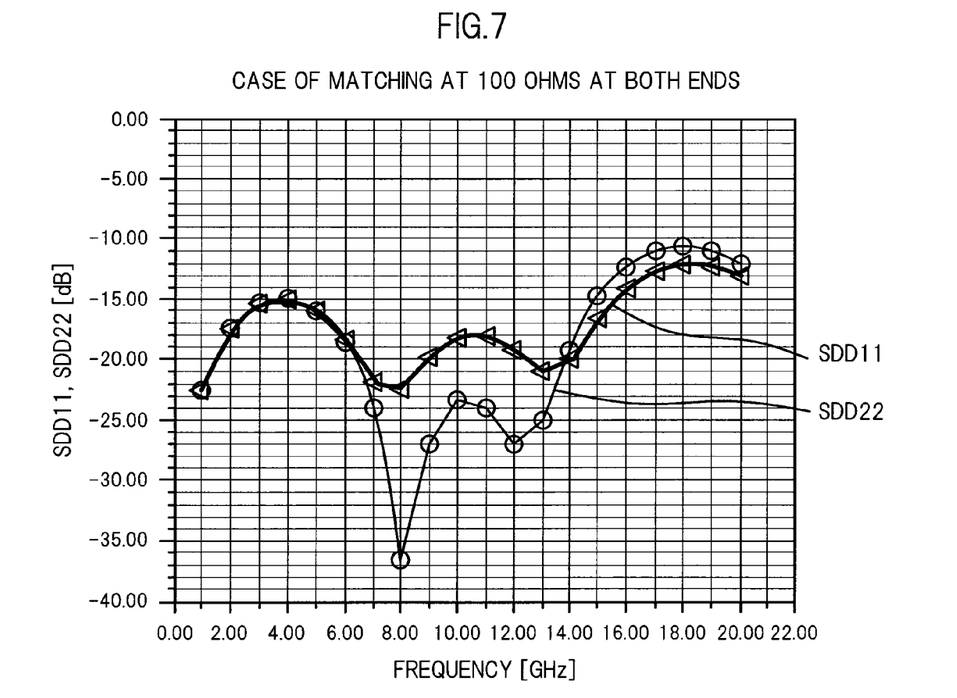
FIG. 7 is a graph illustrating differential mode reflection characteristics of the flexible printed circuit board according to Embodiment 1 of the present invention.

FIG. 7 is a graph illustrating differential mode reflection characteristics SDD11 and SDD22 in the case where loads on the both ends of the flexible printed circuit board 26 (P1 and P2) are set to be 100 ohms. As illustrated in FIG. 7, each of SDD11 and SDD22 shows a value of −15 dB or lower from DC to a frequency of 15 GHz or its vicinity, which means that a good matching condition is realized.

Figure 8:
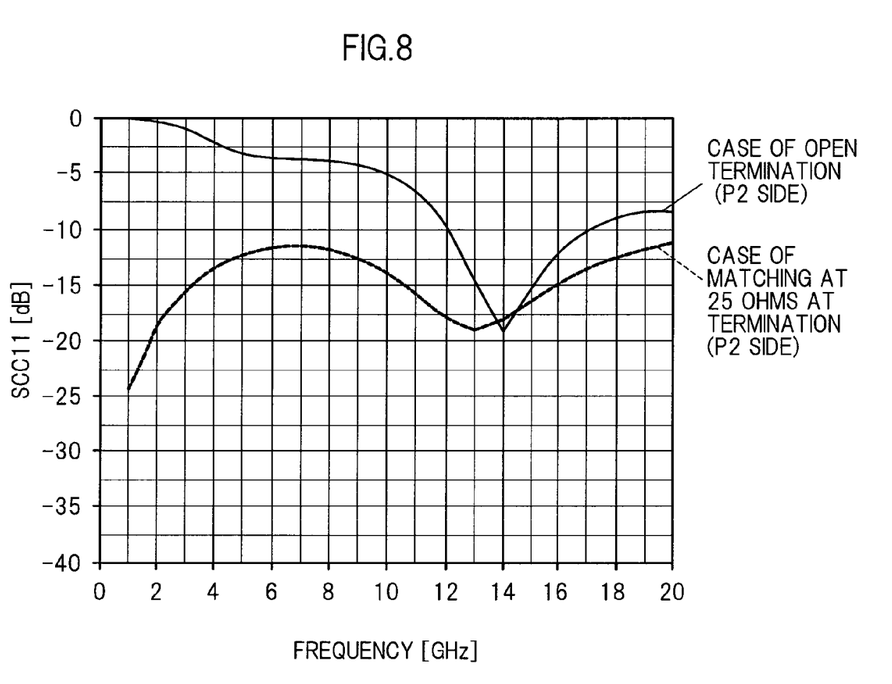
FIG. 8 is a graph illustrating common mode reflection characteristics of the flexible printed circuit board according to Embodiment 1 of the present invention.

FIG. 8 is a graph illustrating common mode reflection characteristics SCC11 when the other end (P2) is viewed from an end (P1) of the flexible printed circuit board 26. As illustrated in FIG. 8, if the load on the P2 side is set to be 25 ohms, good matching characteristics are obtained, which means that the input common mode signal is not reflected but consumed as a loss, that is, heat. If the P2 side is open for simulating the case where a semiconductor laser device is connected, the SCC11 shows a value within the range of −5 to −18 dB at a frequency within the range of 10 to 20 GHz, from which it is understood that the common mode signal is not reflected but consumed as heat.

According to a study by the inventors of the present invention, intensity of the electromagnetic interference (EMI) determined by a three-dimensional electromagnetic field simulation was calculated to be 71 dB ($\mu$V/m) as a maximum field intensity on a sphere having a radius of 3 meters under the condition where a common mode noise source having a frequency of 10.3 GHz and current of 10 mA is disposed at an output terminal of the driver IC 10 in the structure of FIG. 1, and it is supposed that a load viewed from the end P2 of the flexible printed circuit board 26 to the TOSA 6 is open with respect to the common mode. In contrast, as to the conventional flexible printed circuit board in which only a microstrip line is disposed, intensity of the EMI was calculated to be 75 dB ($\mu$V/m). In other words, the effect of reducing EMI by 4 dB was obtained using the flexible printed circuit board 26.

According to the optical transceiver module described above, impedance mismatch with respect to the common mode signal in the case of differential driving of the semiconductor laser device for transmission can be improved without increasing power consumption. Thus, it is possible to provide the 10 Gbit/s optical transceiver module that can decrease both the unintentional electromagnetic waves and the power consumption.

Description of wirings other than the main signal wiring is omitted in FIGS. 1 to 4, but other wirings, e.g., a monitor PD output signal line or a thermistor output signal line may be arranged on the flexible printed circuit board 26.

In addition, the material of the flexible printed circuit board 26 is polyimide in Embodiment 1, but may be liquid crystal polymer. Thus, a dielectric loss (tan $\delta$) of the dielectric material is reduced, and hence a gain decrease in a high frequency range can be improved.

In addition, the thin film resistor layer 28 in Embodiment 1 may be a uniform resistive film, but is possible to use a metal film, e.g., an aluminum film that is formed in a fine mesh shape to have a sheet resistance within a range of 25 to 200 ohms as the thin film resistor layer.

Embodiment 2

An optical transceiver module according to Embodiment 2 of the present invention is described with reference to FIG. 9. The optical transceiver module according to Embodiment 2 is a 10 Gbit/s optical transceiver module having a wavelength of 0.85 $\mu$m, a wavelength of 1.3 $\mu$m, or a wavelength of 1.5 $\mu$m.

Figure 9:
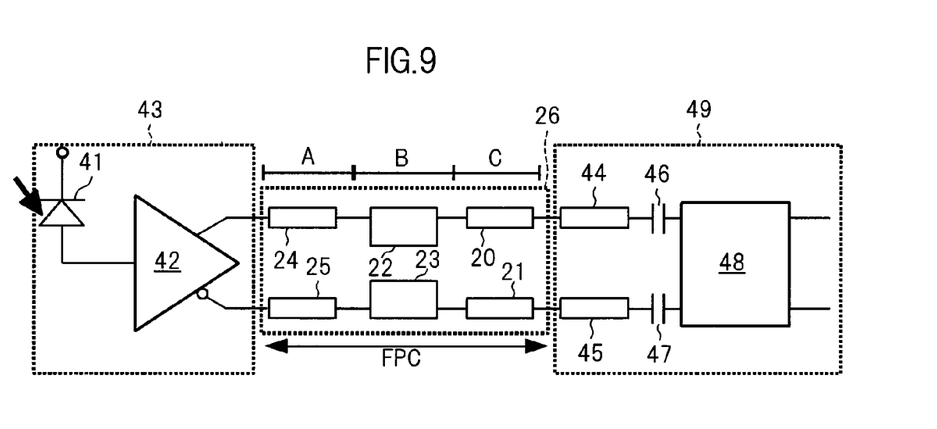
FIG. 9 is a circuit diagram of a receiving part of an optical transceiver module according to Embodiment 2 of the present invention.

FIG. 9 is a circuit diagram of a receiving part of the optical transceiver module according to Embodiment 2. As illustrated in FIG. 9, the optical transceiver module according to Embodiment 2 includes an ROSA 43, a main board 49 on which a post amplifier IC 48 is mounted, and a flexible printed circuit board 26 for connecting the ROSA 43 with the main board 49. While the flexible printed circuit board 26 is used for connecting the TOSA 6 with the main board 9 in Embodiment 1, the flexible printed circuit board 26 is used for connecting the ROSA 43 with the main board 49 in Embodiment 2.

A semiconductor photodiode device 41 and a preamplifier IC 42 are disposed in the ROSA 43. The differential output impedance of the preamplifier IC 42 is 100 ohms, and the output terminals of the preamplifier IC 42 are respectively connected to transmission lines 24 and 25 of the flexible printed circuit board 26.

The main board 49 is a printed circuit board made of a material of FR4, FR5 or the like, for example. Transmission lines 44 and 45, DC cut capacitors 46 and 47, and the post amplifier IC 48 are disposed on the main board 49.

The transmission lines 44 and 45 respectively constitute microstrip lines having a differential impedance of 100 ohms. A differential input impedance of the post amplifier IC 48 is 100 ohms, and a signal delivered from the preamplifier IC 42 is supplied to the post amplifier IC 48 via the transmission lines 44 and 45 and the DC cut capacitors 46 and 47.

The preamplifier IC 42 included in the ROSA 43 is made up of an unbalanced amplifier for a first stage and a balanced amplifier for the last stage in many cases. Therefore, the output signal of the preamplifier IC 42 tends to contain many unbalanced components, i.e., common mode signal components, which may cause the ROSA 43 to be a source of unintentional electromagnetic waves.

As described in Embodiment 1, the flexible printed circuit board 26 suppresses a loss of the differential mode signal and reduces the common mode signal significantly. In Embodiment 2, the flexible printed circuit board 26 is used for connecting the ROSA 43 with the main board 49, and hence as to maintain good quality of the received waveform and significantly attenuate the common mode signal that can be a cause of unintentional electromagnetic waves.

Specifically, according to the optical transceiver module of Embodiment 2, common mode signal components contained in the differential output signal of the preamplifier for amplifying an electric signal of the semiconductor photodiode device for reception can be consumed as heat. Thus, it is possible to provide the 10 Gbit/s optical transceiver module that can reduce the unintentional electromagnetic waves and can improve quality of the received waveform.

Description of wirings other than the main signal wiring is omitted in FIG. 9, but other wirings, e.g., a power supply line for the IC, a power supply line for the photodiode or an output signal line of the thermistor may be arranged on the flexible printed circuit board 26.

Embodiment 3

An optical transceiver module according to Embodiment 3 of the present invention is described with reference to FIGS. 10 to 15. The optical transceiver module according to Embodiment 3 is a 10 Gbit/s optical transceiver module having a wavelength of 1.3 $\mu$m. It is different from Embodiment 1 in that a thin film resistor layer is disposed above the transmission line in a flexible printed circuit board and that a TOSA incorporating a distributed feedback laser diode (DFB-LD) device having a wavelength of 1.3 $\mu$m is used.

Figure 10:
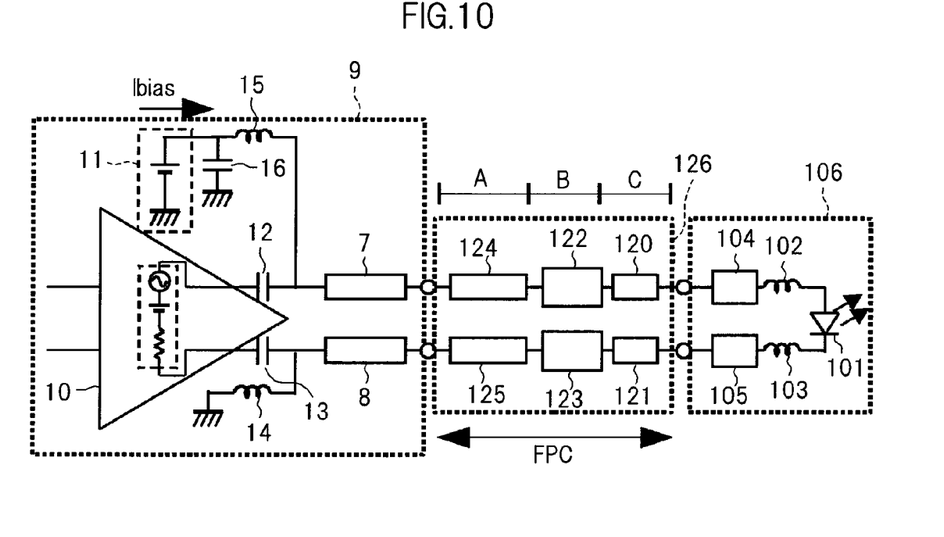
FIG. 10 is a circuit diagram of a transmitting part of an optical transceiver module according to Embodiment 3 of the present invention.

First, a structure of a transmitting part of the optical transceiver module according to Embodiment 3 are described with reference to FIG. 10. FIG. 10 is a circuit diagram of the transmitting part of the optical transceiver module according to Embodiment 3. As illustrated in FIG. 10, the optical transceiver module according to Embodiment 3 includes a TOSA 106, a main board 9 on which a driver IC 10 is mounted, and a flexible printed circuit board 126 for connecting the TOSA 106 with the main board 9.

A DFB-LD device 101 having a wavelength of 1.3 $\mu$m and transmission lines 104 and 105 are disposed in the TOSA 106. An anode terminal and a cathode terminal of the DFB-LD device 101 are respectively connected to transmission lines 120 and 121 formed in the flexible printed circuit board 126 via bonding wires 102 and 103 and the transmission lines 104 and 105.

The transmission lines 104 and 105 are formed on a ceramic substrate made of alumina, aluminum nitride or the like, for example. Each of the transmission lines 104 and 105 constitutes a microstrip line. It is preferable to set each characteristic impedance value of the transmission lines 104 and 105 to be 20 to 25 ohms for impedance matching with a feed through part of a lead pin of the TOSA 106. The bonding wires 102 and 103 are equivalent to series inductances on the circuit, and hence it is preferable to use a wire having a length as short as possible or a plurality of wires for each of the bonding wires 102 and 103 so that the inductance value is reduced for decreasing reflection of a signal.

The flexible printed circuit board 126 includes three regions (A, B and C). Specifically, the flexible printed circuit board 126 has a structure in which the differential transmission lines 120 and 121 formed in the region C, differential transmission lines 122 and 123 formed in the region B and differential transmission lines 124 and 125 formed in the region A are connected in series. The transmission lines 120 and 121 in the region C and the transmission lines 124 and 125 in the region A respectively constitute microstrip lines having a differential impedance of 100 ohms. In addition, as described later, the transmission lines 122 and 123 in the region B respectively constitute microstrip lines having a differential impedance of approximately 100 ohms.

Figure 11:
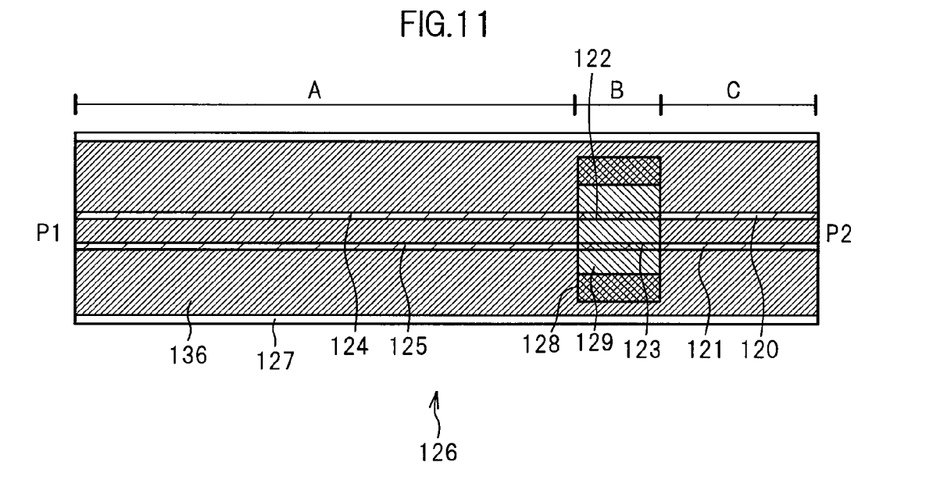
FIG. 11 is a top view of a flexible printed circuit board according to Embodiment 3 of the present invention.
Figure 12:
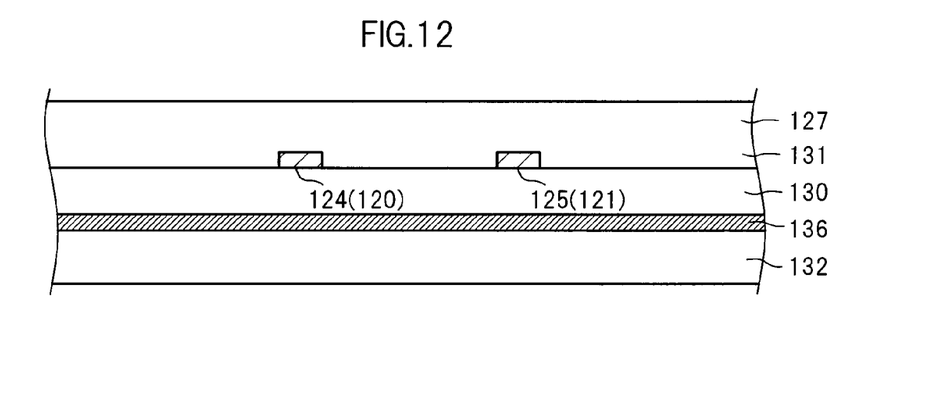
FIG. 12 is a cross sectional view of the flexible printed circuit board according to Embodiment 3 of the present invention.
Figure 13:
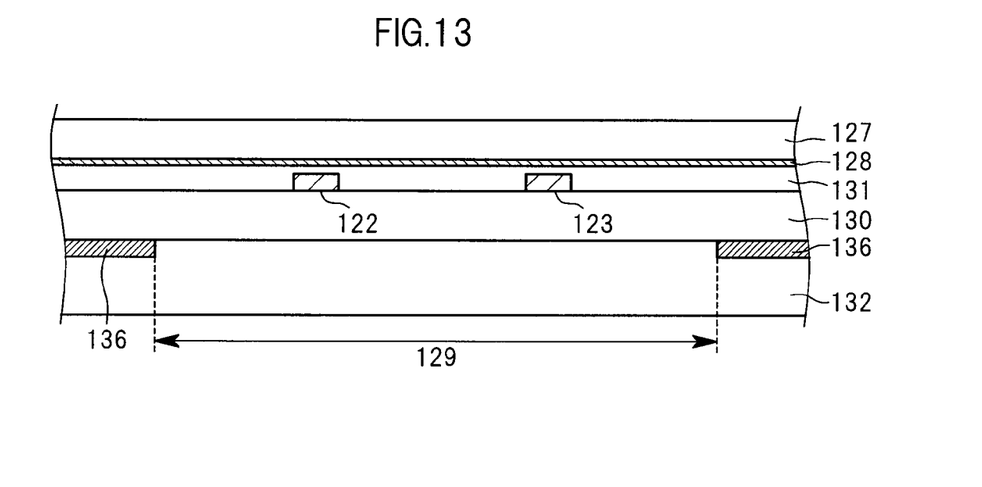
FIG. 13 is a cross sectional view of the flexible printed circuit board according to Embodiment 3 of the present invention.

Next, the structure of the flexible printed circuit board 126 is described in more detail with reference to FIGS. 11 to 13. FIG. 11 is a top view of the flexible printed circuit board 126. FIG. 12 is a cross sectional view of the flexible printed circuit board 126 in the region A (or the region C). FIG. 13 is a cross sectional view of the flexible printed circuit board 126 in the region B.

The region A (or the region C) on the flexible printed circuit board 126 has a structure as illustrated in FIG. 12, in which a dielectric layer (insulating layer) 132, a ground conductor (ground layer) 136, a dielectric layer (insulating layer) 130, the transmission lines 124 and 125 (or 120 and 121), a dielectric layer (insulating layer) 131, and a dielectric layer (insulating layer) 127 are laminated in this order.

Each of the transmission lines 124 and 125 (or 120 and 121) constitutes an ordinary microstrip line together with the ground conductor 136. Specifically, the transmission lines 124 and 125 (or 120 and 121) serving as strip conductors are formed on the top surface of the dielectric layer 130, and the ground conductor 136 is formed on the bottom surface of the dielectric layer 130 so as to face the transmission lines 124 and 125 (or 120 and 121). In addition, the dielectric layers 127, 131 and 132, each of which is made of a composite material of polyimide and adhesive, are formed on top and bottom of them to cover the microstrip lines.

Each of the transmission lines 124 and 125 (or 120 and 121) is made of copper foil that has a thickness of 28 μm and is cut to have a width of 80 μm. The ground conductor 136 is made of copper foil having a thickness of 28 μm. A thickness of the dielectric layer 130 is 50 μm, and polyimide is used as a material thereof. This structure constitutes the microstrip line having a differential impedance of 100 ohms.

On the other hand, the region B on the flexible printed circuit board 126 has a structure in which the dielectric layer 132, the ground conductor 136, the dielectric layer 130, the transmission lines 122 and 123, the dielectric layer 131, a thin film resistor layer 128, and the dielectric layer 127 are laminated in this order as illustrated in FIG. 13.

Each of the transmission lines 122 and 123 constitutes a microstrip line together with the thin film resistor layer 128. Specifically, the transmission lines 122 and 123 serving as the strip conductors are formed on the bottom surface of the dielectric layer 131, and the thin film resistor layer 128 is formed on the top surface of the dielectric layer 131 so as to face the transmission lines 122 and 123.

This thin film resistor layer 128 has a function of attenuating a part of the high frequency signal transmitted through the microstrip line. It is because when the high frequency signal is transmitted through the microstrip line, magnetic fluxes generated in the vicinity of the microstrip line vary and cause eddy current in the thin film resistor layer 128, whereby a part of the high frequency signal is consumed as heat. Note that the thin film resistor layer 128 preferably has a thickness of 1 μm or thinner and a sheet resistance value of 25 to 200 ohms.

In addition, as illustrated in FIG. 13, the ground conductor 136 is formed on the bottom surface of the dielectric layer 130 in the region facing a part of the thin film resistor layer 128 except for the region facing the transmission lines 122 and 123. In other words, the ground conductor 136 having an opening part 129 that is a part of the region facing the thin film resistor layer 128 is formed on the bottom surface of the dielectric layer 130 as illustrated in FIG. 11.

The thin film resistor layer 128 is not connected via a conductor to any of the transmission lines 122 and 123 and the ground conductor 136 connected to the ground potential, and hence it is in a floating state in terms of DC. However, the thin film resistor layer 128 is coupled electromagnetically to the ground conductor 136 for a high frequency signal in the region where they face each other. In the region where the thin film resistor layer 128 is coupled electromagnetically to the ground conductor 136, potential of the thin film resistor layer 128 becomes close to the ground potential. Therefore, a distance between the transmission line 122 or 123 and the ground potential is reduced, which acts so as to decrease the differential impedance of the microstrip line in the region B. On the contrary, the opening part 129 of the ground conductor 136 increases the distance between the transmission line 122 or 123 and the ground potential. In other words, the opening part 129 works to increase the differential impedance of the microstrip line in the region B. Therefore, the opening part 129 of the ground conductor 136 is an essential structure for setting the differential impedance of the microstrip line in the region B to be close to 100 ohms.

In the region B on the flexible printed circuit board 126, the width of the transmission lines 122 and 123 is set to be 80 μm, the space between the transmission lines 122 and 123 is set to be 0.92 mm, the width of the opening part 129 of the ground conductor 136 is set to be 1.8 mm, the width of the thin film resistor layer 128 is set to be 3.2 mm, and the thickness of the dielectric layer 131 is set within the range of 12 to 24 μm, and hence as to constitute the microstrip line having a differential impedance close to 100 ohms.

Note that the sheet resistance of the thin film resistor layer 128 and the length of the region B can be changed as design values for obtaining desired characteristics. For instance, the sheet resistance was set to be 25 ohms, the length of the region B was set to be 2.4 mm, and the entire length of the flexible printed circuit board 126 was set to be 10 mm, whereby the following characteristics were obtained.

Figure 14:
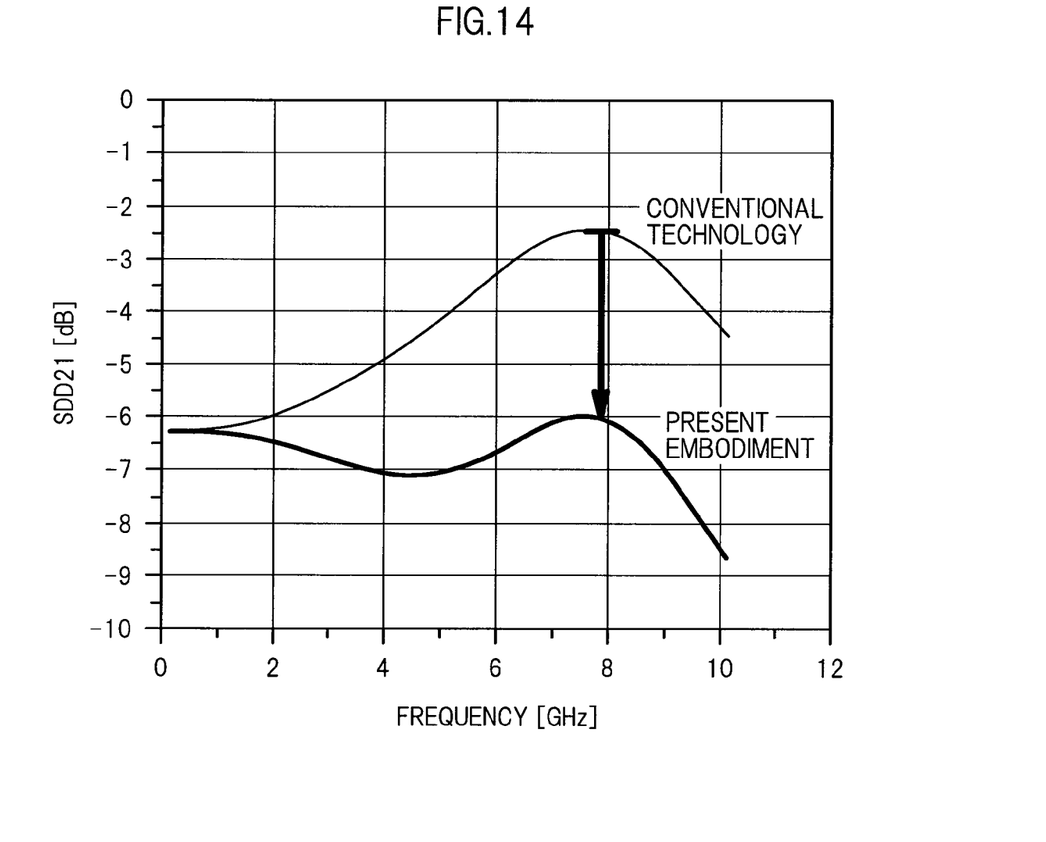
FIG. 14 is a graph illustrating differential mode transmission characteristics of the flexible printed circuit board according to Embodiment 3 of the present invention.
Figure 15:
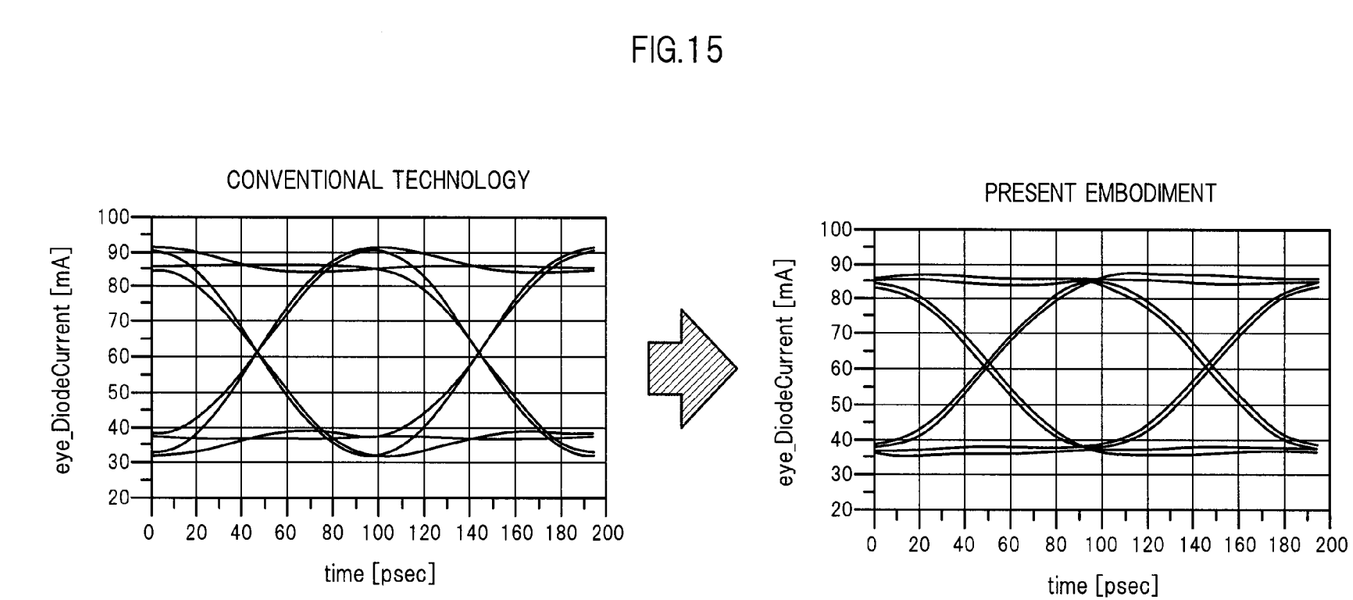
FIG. 15 are a graph illustrating a current waveform (eye pattern) of a DFB-LD device according to Embodiment 3 of the present invention, and a graph illustrating a current waveform according to a conventional technology.

Hereinafter, the effect of Embodiment 3 of the present invention is described with reference to FIGS. 14 and 15 illustrating small signal characteristics.

FIG. 14 is a graph illustrating differential mode transmission characteristics SDD21 from the output terminals of the driver IC 10 to both terminals of the DFB-LD device 101.

FIG. 14 illustrates that a variation of the SDD21 from DC to a frequency of 8 GHz is as small as approximately 1 dB.

As to the flexible printed circuit board 126 according to Embodiment 3, the space between the transmission lines 122 and 123 is not decreased in the region B (i.e., widths of the transmission lines 122 and 123 are not increased in the inward direction). Therefore, a loss of the flexible printed circuit board 126 is larger than that of the flexible printed circuit board 26 according to Embodiment 1 in the differential mode. In addition, a differential transmission loss at a frequency of 10 GHz is set to be approximately 2 dB in the flexible printed circuit board 126. Thus, the differential mode transmission characteristics SDD21 between the driver IC 10 and the DFB-LD device 101 can be substantially flat.

On the other hand, in the case of the conventional flexible printed circuit board having only a microstrip line, a variation of the SDD21 from DC to a frequency of 8 GHz is as large as approximately 4 dB. A gain increases along with an increase of the frequency and has a peak at 8 GHz or its vicinity.

FIG. 15 are a graph illustrating a current waveform (eye pattern) of the DFB-LD device 101, and a graph illustrating a current waveform according to a conventional technology. As illustrated in FIG. 15, in the case of using the conventional flexible printed circuit board, a wave height of a high frequency component becomes high so that waveform deterioration occurs. On the other hand, in the case of using the flexible printed circuit board 126 having the flat differential mode transmission characteristics SDD21, a good waveform with a fine line width can be realized.

The DFB-LD device having a wavelength of 1.3 μm is used widely as a semiconductor laser device for transmission of the 10 Gbit/s optical transceiver module having a transmission distance within the range of 2 to 10 km. A series resistance of this device is as low as 6 to 10 ohms, and hence it is necessary to drive it by large current close to 100 mA in order to obtain a good optical waveform in high temperature operation.

Therefore, conventionally, the transmission line having a characteristic impedance of approximately 25 ohms and a special driver IC having a low output impedance corresponding thereto (e.g., driver IC having a differential impedance of 50 ohms) are used for decreasing impedance mismatch between the transmission line and the semiconductor device, and hence as to obtain a good optical output waveform of the optical transceiver module.

In contrast, as to the optical transceiver module according to Embodiment 3, the output signal of the balanced driver IC 10 having the differential output impedance of 100 ohms is supplied via the flexible printed circuit board 126 to the anode terminal and the cathode terminal of the DFB-LD device 101. Thus, the differential mode transmission characteristics SDD21 between the driver IC 10 and the DFB-LD device 101 are improved so that a high quality output waveform can be obtained.

Therefore, if the flexible printed circuit board 126 is used, a common design of the main board 9 can be used between the optical transceiver module having a wavelength of 0.85 μm (a series resistance of the semiconductor laser device is within the range of 6 to 10 ohms) and the optical transceiver module having a wavelength of 1.3 μm (a series resistance of the semiconductor laser device is within the range of 50 to 100 ohms). Thus, it is possible to achieve commonality of components and to reduce steps for designing, and hence cost of the optical transceiver module can be reduced.

As described above, according to Embodiment 3, it is possible to provide a 10 Gbit/s optical transceiver module that can reduce both the unintentional electromagnetic waves and cost thereof.

Embodiment 4

A flexible printed circuit board 226 according to Embodiment 4 of the present invention is described with reference to FIGS. 16 to 18. The flexible printed circuit board 226 is used for connecting a TOSA with a main board of an optical transceiver module (not shown) similarly to Embodiment 1 (see FIG. 1, for example). However, the flexible printed circuit board 226 has a structure different from that of the flexible printed circuit board 26 according to Embodiment 1 in that a thin film resistor layer is provided not above a ground conductor but in the entire region below the ground conductor.

Figure 16:
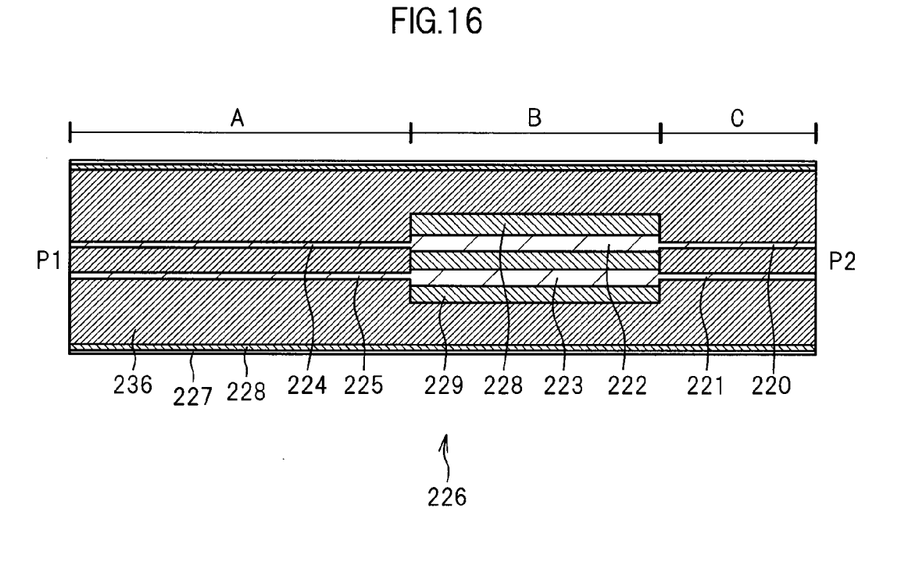
FIG. 16 is a top view of a flexible printed circuit board according to Embodiment 4 of the present invention.

FIG. 16 is a top view of the flexible printed circuit board 226. As illustrated in FIG. 16, the flexible printed circuit board 226 includes three regions (A, B and C). Specifically, the flexible printed circuit board 226 has a structure in which differential transmission lines 220 and 221 formed in the region C, differential transmission lines 222 and 223 formed in the region B, and differential transmission lines 224 and 225 formed in the region A are connected in series. The transmission lines 220 and 221 in the region C and the transmission lines 224 and 225 in the region A respectively constitute microstrip lines having a differential impedance of 100 ohms. In addition, as described later, each of the transmission lines 222 and 223 in the region B constitutes a microstrip line having a differential impedance of approximately 100 ohms.

Figure 17:
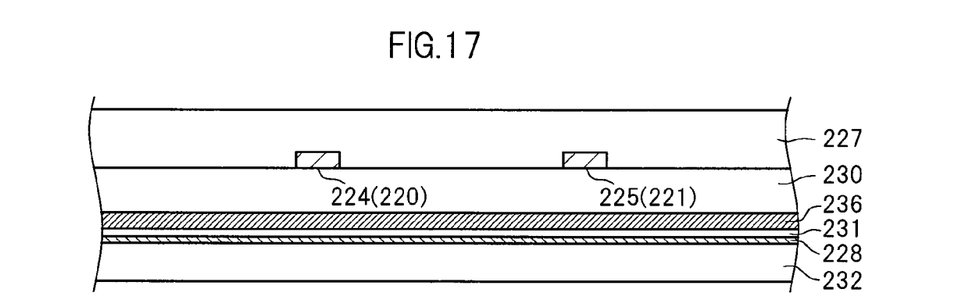
FIG. 17 is a cross sectional view of the flexible printed circuit board according to Embodiment 4 of the present invention.

FIG. 17 is a cross sectional view of the flexible printed circuit board 226 in the region A (or the region C). As illustrated in FIG. 17, the region A (or the region C) on the flexible printed circuit board 226 has a structure in which a dielectric layer (insulating layer) 232, a thin film resistor layer 228, a dielectric layer (insulating layer) 231, a ground conductor (ground layer) 236, a dielectric layer (insulating layer) 230, the transmission lines 224 and 225 (or 220 and 221), and a dielectric layer (insulating layer) 227 are laminated in this order.

Each of the transmission lines 224 and 225 (or 220 and 221) constitutes a microstrip line together with the ground conductor 236. Specifically, the transmission lines 224 and 225 (or 220 and 221) serving as strip conductors are formed on the top surface of the dielectric layer 230, and the ground conductor 236 is formed on the bottom surface of the dielectric layer 230 so as to face the transmission lines 224 and 225 (or 220 and 221).

Each of the transmission lines 224 and 225 is made of copper foil that has a thickness of 28 μm and is cut to have a width of 80 μm. The ground conductor 236 is made of copper foil having a thickness of 28 μm. A thickness of the dielectric layer 230 is 50 μm, and polyimide is used as a material thereof. This structure constitutes the microstrip line having a differential impedance of 100 ohms.

In addition, the dielectric layer 227 made of a composite material of polyimide and adhesive is formed on the transmission lines 224 and 225, and the dielectric layer 231 made of polyimide, the thin film resistor layer 228, and the dielectric layer 232 made of a composite material of polyimide and adhesive are formed under the ground conductor 236. The ground conductor 236 is disposed between the transmission lines 224 and 225 (or 220 and 221) and the thin film resistor layer 228, and hence the thin film resistor layer 228 has extremely little influence on the microstrip line constituted by the transmission lines 224 and 225 (or 220 and 221) and the ground conductor 236. Therefore, it is possible in the flexible printed circuit board 226 to omit patterning of the thin film resistor layer that is necessary in Embodiments 1 to 3.

Figure 18:
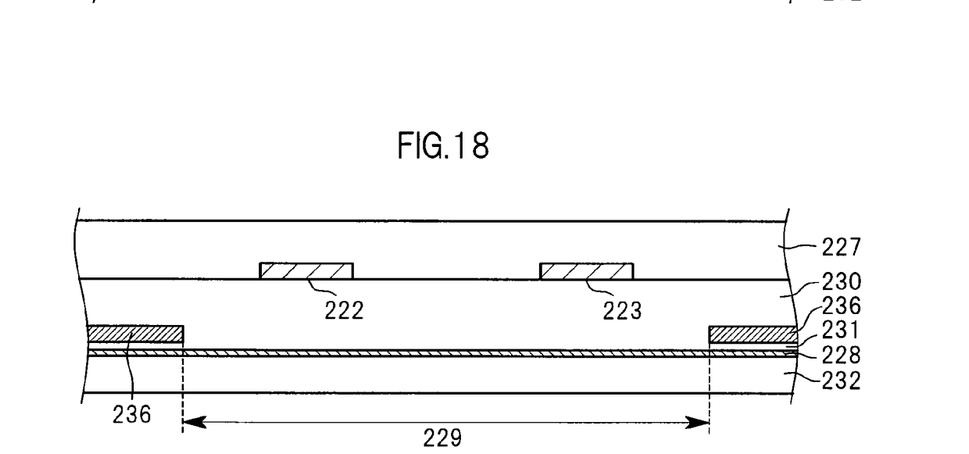
FIG. 18 is a cross sectional view of the flexible printed circuit board according to Embodiment 4 of the present invention.

FIG. 18 is a cross sectional view of the flexible printed circuit board 226 in the region B. As illustrated in FIG. 18, the region B on the flexible printed circuit board 226 has a structure in which the dielectric layer 232, the thin film resistor layer 228, the dielectric layer 231, the ground conductor 236, the dielectric layer 230, the transmission lines 222 and 223, and the dielectric layer 227 are laminated in this order.

The ground conductor 236 is formed on the top surface of the dielectric layer 231 in the region facing a part of the thin film resistor layer 228 except for the region facing the transmission lines 222 and 223. In other words, the ground conductor 236 having an opening part 229 that is a part of the region facing the thin film resistor layer 228 (part of the region B) is formed on the top surface of the dielectric layer 231 as illustrated in FIG. 16. Thus, the microstrip line is constituted between the transmission line 222 or 223 and thin film resistor layer 228 so as to sandwich the opening part 229 of the ground conductor 236.

This thin film resistor layer 228 has a function of attenuating a part of the high frequency signal transmitted through the microstrip line. It is because when the high frequency signal is transmitted through the microstrip line, magnetic fluxes generated in the vicinity of the microstrip line vary and cause eddy current in the thin film resistor layer 228, whereby a part of the high frequency signal is consumed as heat. Note that the thin film resistor layer 228 preferably has a thickness of 1 μm or thinner and a sheet resistance value of 25 to 200 ohms.

In addition, as illustrated in FIGS. 16 to 18, the transmission lines 222 and 223 in the region B are formed to have a larger width toward both sides thereof compared with the transmission lines 224 and 225 (or 220 and 221) in the region A (region C). It is for the purpose of decreasing the space between the transmission lines 222 and 223 in the region B to be smaller than the space between the transmission lines 224 and 225 (or 220 and 221) in the region A (region C).

In the part having a small space between the differential lines, coupling between the differential signals becomes strong. For this reason, in the region B having the small space between the transmission lines 222 and 223, density of the magnetic flux in the thin film resistor layer 228 generated along with the transmission of the differential signal is low, and hence the eddy current flowing in the thin film resistor layer 228 is low. In contrast, even if the space between the differential lines becomes small, coupling between the common mode signals does not occur. Therefore, in the region B having a small space between the transmission lines 222 and 223, it is possible to suppress a loss of the differential signal and to reduce the common mode signal significantly.

Note that the transmission lines 222 and 223 having a width larger than the transmission lines 224 and 225 (or 220 and 221) act so as to decrease the differential impedance of the microstrip line in the region B. On the other hand, the opening part 229 of the ground conductor 236 increases the distance between the transmission line 222 or 223 and the ground potential. In other words, the opening part 229 works to increase the differential impedance of the microstrip line in the region B.

In the region B on the flexible printed circuit board 226, the width of the transmission lines 222 and 223 is set to be 0.21 mm, the space between the transmission lines 222 and 223 is set to be 0.78 mm, the width of the opening part 229 of the ground conductor is set to be 1.8 mm, and the thickness of the dielectric layer 231 is set to be 12 μm, and hence as to constitute the microstrip line having a differential impedance close to 100 ohms.

Note that the sheet resistance of the thin film resistor layer 228 and the length of the region B can be changed as design values for obtaining desired characteristics. For instance, the sheet resistance was set to be 25 ohms, the length of the region B was set to be 7.8 mm, and the entire length of the flexible printed circuit board 226 was set to be 10 mm, whereby characteristics similar to the characteristics shown in Embodiment 1 were obtained.

According to the flexible printed circuit board 226 of Embodiment 4, manufacturing cost can be reduced by omitting patterning of the thin film resistor layer 228, and a variation of the transmission characteristics accompanying with a pattern shift of the thin film resistor layer 228 can be avoided.

According to Embodiments 1 to 4 described above, the common mode signal contained in the high frequency differential signal transmitted through the microstrip line can be consumed as heat in the thin film resistor layer formed in the flexible printed circuit board. Therefore, the unintentional electromagnetic waves radiated due to reflection of the common mode signal can be reduced. In addition, it is not necessary to provide the resistor element for impedance matching between the terminal of the optical device and the ground potential, and hence it is also possible to prevent an increase in power consumption. Therefore, it is possible to provide an optical communication module and a flexible printed circuit board that can reduce both the unintentional electromagnetic waves radiated when a high frequency differential signal is transmitted and power consumption.

Note that the present invention is not limited to the embodiments described above.

For instance, the shape of the transmission line and the shape of the opening part of the ground conductor in the region B on the flexible printed circuit board are not limited to the rectangle as long as the shape makes the differential impedance of the microstrip line in the region B be close to a predetermined value (e.g., 100 ohms).

In addition, the signal wiring pattern, the pattern of the thin film resistor layer, and the pattern of the ground conductor which are formed in the flexible printed circuit board can be formed integrally or discretely for each of the regions (A, B and C).

In addition, the components of the optical transceiver module and materials of the flexible printed circuit board described in the above-mentioned embodiments are merely examples. The present invention can also be applied to an optical communication module constituted by other devices and to a flexible printed circuit board made of other materials.

While there have been described what are at present considered to be certain embodiments of the invention, it is understood that various modifications may be made thereto, and it is intended that the appended claims cover all such modifications as fall within the true spirit and scope of the invention.

What is claimed is:

1. An optical communication module, comprising:
   an optical device;
   a main board incorporating a signal generation circuit for generating a high frequency signal corresponding to an optical signal converted by the optical device; and
   a flexible printed circuit board for connecting the optical device with the main board,
   wherein the flexible printed circuit board comprises:
      a signal wiring pattern comprising:
         a first transmission line for connecting an end of the optical device with an end of the signal generation circuit; and
         a second transmission line for connecting another end of the optical device with another end of the signal generation circuit;

a thin film resistor layer formed in a region including at least a part of a region facing the signal wiring pattern so as to constitute a first microstrip line together with each of the first transmission line and the second transmission line;

a ground layer formed in a region except a part of a region facing the thin film resistor layer within a region including a region facing the signal wiring pattern so as to constitute a second microstrip line together with the each of the first transmission line and the second transmission line; and an insulating layer formed between each two of the signal wiring pattern, the thin film resistor layer, and the ground layer.

2. An optical communication module according to claim 1, wherein the signal wiring pattern is formed so that a space between the first transmission line and the second transmission line in a part facing the thin film resistor layer is smaller than a space in another part.

3. An optical communication module according to claim 2, wherein the first transmission line and the second transmission line are formed so that a width of the part facing the thin film resistor layer is larger than a width of the another part.

4. An optical communication module according to claim 1, wherein the ground layer is formed so that the part of the region facing the thin film resistor layer is an opening part.

5. An optical communication module according to claim 1, wherein the ground layer, the thin film resistor layer, and the signal wiring pattern are laminated in the stated order sandwiching the insulating layer.

6. An optical communication module according to claim 1, wherein the ground layer, the signal wiring pattern, and the thin film resistor layer are laminated in the stated order sandwiching the insulating layer.

7. An optical communication module according to claim 1, wherein the thin film resistor layer, the ground layer, and the signal wiring pattern are laminated in the stated order sandwiching the insulating layer.

8. A flexible printed circuit board for connecting an optical device with a main board incorporating a signal generation circuit for generating a high frequency signal corresponding to an optical signal converted by the optical device, the flexible printed circuit board comprising:

a signal wiring pattern comprising:
  a first transmission line for connecting an end of the optical device with an end of the signal generation circuit; and
  a second transmission line for connecting another end of the optical device and another end of the signal generation circuit;

a thin film resistor layer formed in a region including at least a part of a region facing the signal wiring pattern so as to constitute a first microstrip line together with each of the first transmission line and the second transmission line;

a ground layer formed in a region except a part of a region facing the thin film resistor layer within a region including a region facing the signal wiring pattern so as to constitute a second microstrip line together with the each of the first transmission line and the second transmission line; and an insulating layer formed between each two of the signal wiring pattern, the thin film resistor layer, and the ground layer.

* * * * *